(12) United States Patent
Dholakia et al.

(10) Patent No.: US 7,797,611 B2
(45) Date of Patent: Sep. 14, 2010

(54) CREATING AN ERROR CORRECTION CODING SCHEME AND REDUCING DATA LOSS

(75) Inventors: Ajay Dholakia, Apex, NC (US);
Evangelos Elftheriou, Zurich (CH);
Xiaoyu Hu, Winterthur (CH); Ilias Iliadis, Rueschlikon (CH)

(73) Assignee: International Business Machines Corporation, Armonk, NY (US)

( * ) Notice: Subject to any disclaimer, the term of this patent is extended or adjusted under 35 U.S.C. 154(b) by 979 days.

(21) Appl. No.: 11/595,243

(22) Filed: Nov. 9, 2006

(65) Prior Publication Data

US 2007/0198890 A1    Aug. 23, 2007

(30) Foreign Application Priority Data

Nov. 14, 2005 (EP) ................... 05110718

(51) Int. Cl.
*G11C 29/00* (2006.01)
(52) U.S. Cl. .............. 714/770; 714/758; 714/762; 714/777
(58) Field of Classification Search .......... 714/758, 714/762, 770
See application file for complete search history.

(56) References Cited

U.S. PATENT DOCUMENTS

| | | | | |
|---|---|---|---|---|
| 7,058,873 | B2 * | 6/2006 | Song et al. | 714/752 |
| 7,260,763 | B2 * | 8/2007 | Sukhobok et al. | 714/758 |
| 7,278,085 | B1 * | 10/2007 | Weng et al. | 714/766 |
| 7,328,397 | B2 * | 2/2008 | Lunelli et al. | 714/785 |
| 7,370,264 | B2 * | 5/2008 | Worley et al. | 714/781 |
| 7,461,329 | B2 * | 12/2008 | Piret et al. | 714/799 |

FOREIGN PATENT DOCUMENTS

CN         610062        9/2003

* cited by examiner

*Primary Examiner*—Esaw T Abraham
(74) *Attorney, Agent, or Firm*—Cantor Colburn LLP

(57) ABSTRACT

A method for reducing data loss includes a first computing step for computing an intermediate result for each redundancy information entity of a redundancy set by processing respectively associated data information entities of a given data set on at least two main diagonals of a parity check matrix representing an error correction coding scheme. The method further includes a second computing step for computing the information content of the respective redundancy information entity dependent on the respective intermediate result.

3 Claims, 5 Drawing Sheets

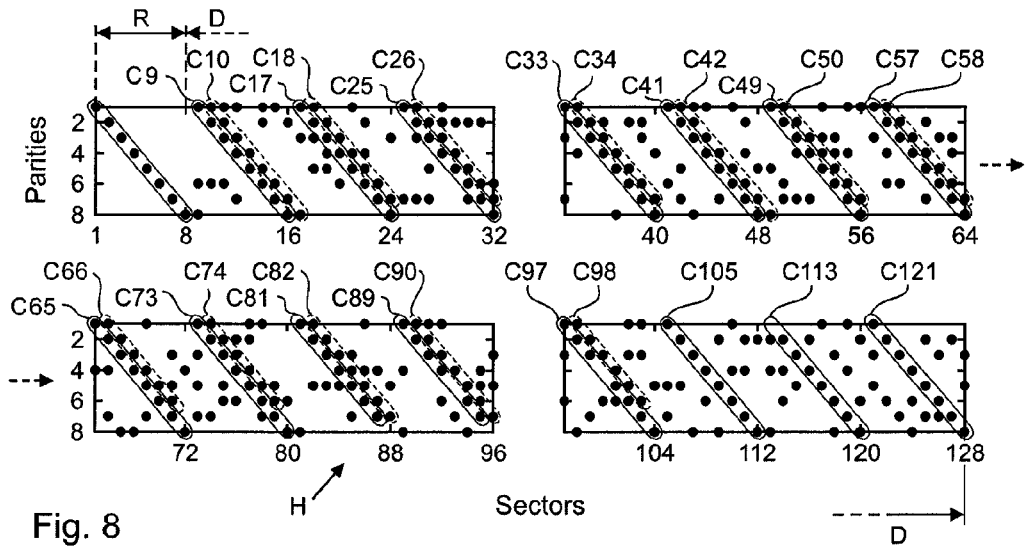
Fig. 8
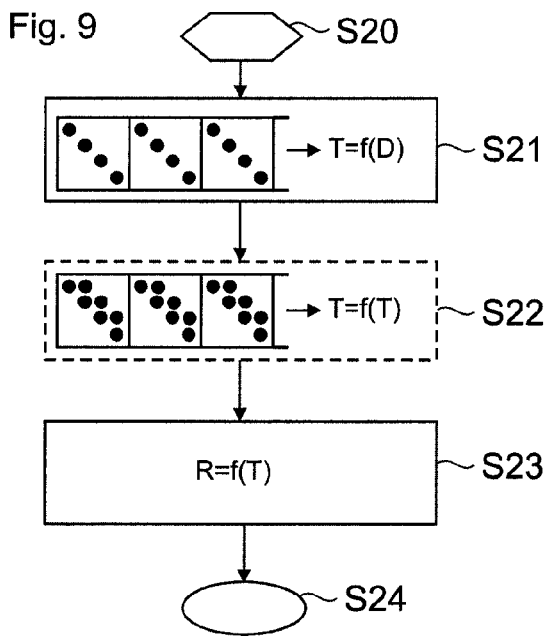
Fig. 9
Fig. 10
| XOR-based codes(128,120) | Hamming Distance | Burst erasure recovery (sectors) | Number of 1s in parity-check matrix | XORO | MBWC (4KB units) |
|---|---|---|---|---|---|
| Extended Hamming code | 4 | 8 | 512 | 512 | 95 |
| SD3 | 3 | 8 | 376 | 376 | 78 |
| OSD3 | 3 | 8 | 376 | 202 | 69 |
| IPC-8 | 2 | 8 | 128 | 16 | 47 |

CREATING AN ERROR CORRECTION CODING SCHEME AND REDUCING DATA LOSS

BACKGROUND

1. Technical Field

The present invention relates to a method for creating an error correction coding scheme for reducing data loss. It further relates to a method, a device, a computer program product and a computer program for reducing data loss. It further relates to a system for protecting data stored on at least one storage unit against uncorrectable media errors.

2. Background Art

A storage unit is, for example, based on at least one magnetic disk or optical disk or on solid state memory as a storage medium. As the storage capacity of individual storage units grows, the probability of encountering at least one media-related error while reading data stored on at least one storage medium of a storage unit also increases. Data is lost when the error cannot be corrected by re-reading the specific part of the medium. Reliability of systems comprising two or more storage units can be increased by storing redundant data distributed to the two or more storage units. Such systems are known as redundant array of independent disks (RAID). A RAID configured system primarily reduces data loss due to a complete failure of a storage unit.

U.S. 2005/0108594 A1 discloses a method to protect data on a disk drive against uncorrectable media errors. The protection against uncorrectable media errors is provided for a RAID configured storage system by a technique in which redundancy information sectors are associated with data information sectors. The data information sectors and the redundancy information sectors are written as a single segment on a single storage unit. The redundancy information is either based on a Reed-Solomon code, an XOR-based code or one-dimensional parity.

Accordingly, it is desirable to provide a method for creating a coding scheme for reducing data loss that is simpler than previously-proposed techniques. It is also desirable to provide a method, a device, a computer program and a computer program product for reducing data loss that is simpler than previously-proposed techniques. It is further also desirable to provide a system for protecting data stored on at least one storage unit against uncorrectable media errors that is simpler and more reliable than previously-proposed techniques.

SUMMARY OF THE INVENTION

According to an embodiment of a first aspect of the present invention, there is provided a method for creating an error correction coding scheme for reducing data loss, the data comprising a given redundancy set of at least two redundancy information entities associated to a given data set of at least two data information entities, the information content of the redundancy set being computed dependent on the information content of the data set, the method comprising the steps of: a base selection step for selecting a base coding scheme represented by a base matrix wherein each redundant information entity is represented by a row and each information entity is represented by a column, and a matrix setup step for setting up a target matrix with a subset of columns of the base matrix and for varying the order of columns in respect to the base matrix until the target matrix satisfies a given pattern of non-zero elements to at least a given extent. This feature enables construction of a computing engine for computing the information content of the redundancy set, which is simpler than computing engines used in previously-proposed techniques. The given pattern of non-zero elements influences the complexity of the error correction coding scheme and, by this, also its implementation in the computing engine. The information entity may be one bit or byte or a sector on a storage unit or any other suitable entity for storing or transmitting or receiving information.

According to a preferred embodiment of the first aspect of the invention, the given pattern of non-zero elements is selected to comprise a main diagonal with elements being predominantly non-zero of a square pattern sub-matrix of the target matrix having a number of rows and columns equal to a number of redundancy information entities in the redundancy set. The given pattern of non-zero elements is thus simpler and regular and enables a simpler construction of the computing engine.

In this respect, it is advantageous that the given pattern of non-zero elements is selected to further comprise a neighboring diagonal disposed adjacent to the main diagonal of the square pattern sub-matrix of the target matrix, the elements of the neighbouring diagonal being chosen to be predominantly non-zero. This enables the construction of the computing engine such that elements of the neighboring diagonal can be processed by utilizing an intermediate result computed from elements of the main diagonal. The computing engine can thus be more efficient.

According to a further preferred embodiment of the first aspect of the invention, the base matrix is selected to have the least possible number of non-zero elements for a given Hamming distance of the base coding scheme, number of data information entities in the data set and number of redundancy information entities in the redundancy set. This enables a reduced number of operations for computing the information content of the redundancy set.

According to a further preferred embodiment of the first aspect of the invention, in the matrix setup step, the order of the columns is varied until each square check sub-matrix of the target matrix with a number of columns equal to the number of redundancy information entities in the redundancy set has a rank equal to the number of redundancy information entities in the redundancy set. This enables recovering of up to the number of redundancy information entities in the redundancy set consecutive unreadable data information entities, also called "erasures". By this, the data can be protected more reliably against data loss and the possibility of data loss is reduced.

According to a further preferred embodiment of the first aspect of the invention, the created error correction scheme is based on respectively computing the exclusive-or of the information content of all data information entities represented by a non-zero element in each row of the target matrix. This enables a simpler and higher performance error correction coding scheme with a reduced overhead for computing the redundancy set and that is also more readily implemented compared to previously-proposed techniques.

In this respect, it is advantageous if the base coding scheme is based on one of the following: a Hamming code or an extended Hamming code. This enables more reliability of the error correction coding scheme.

According to an embodiment of a second aspect of the invention, there is provided a method for reducing data loss, the data comprising a given redundancy set of at least two redundancy information entities associated to a given data set of at least two data information entities, the information content of the redundancy set being computed dependent on the information content of the data set by applying an error correction coding scheme represented by a parity check matrix wherein each redundant information entity is represented by a row and each information entity of the data is represented by a column, and at least two square sub-matrices of the parity check matrix having a main diagonal with elements being predominantly non-zero and having a number of rows and columns equal to a number of redundancy information entities in the redundancy set and representing consecutively placed data information entities of the data set, comprising: a first computing step for computing an intermediate result for the redundancy information entities by processing the data information entities on the at least two main diagonals, and a second computing step for computing the information content of the redundancy information entities dependent on the intermediate result. Due to the at least two square sub-matrices of the parity check matrix having elements of the main diagonal being predominantly non-zero the computation of information content of the redundancy set is simpler.

According to a preferred embodiment of the second aspect of the invention, at least one square sub-matrix of the parity check matrix with elements of the main diagonal being predominantly non-zero further has a neighboring diagonal with elements being predominantly non-zero and the second computing step comprises processing the data information entities on the respective neighboring diagonal utilizing the intermediate result. This enables to compute the information content of the redundancy set more efficiently.

According to a further preferred embodiment of the second aspect of the invention, the respective information content of each redundancy information entity in the redundancy set is computed as exclusive-or of the respective information content of all data information entities in the data set represented by a non-zero element in the respective row of the parity check matrix. This enables computation of the information content of the redundancy set with reduced overhead resulting in higher performance. The method is further easier to implement.

According to an embodiment of a third aspect of the present invention, there is provided a device for reducing data loss. The device corresponds to an embodiment of the second aspect of the present invention and the advantages thereof.

According to an embodiment of a fourth aspect of the present invention, there is provided a system for protecting data stored on at least one storage unit against uncorrectable media errors. The system comprises a device embodying the third aspect of the present invention and at least one storage unit. Each information entity represents a sector on the at least one storage unit. The system corresponds to the device and the advantages thereof.

According to a preferred embodiment of the fourth aspect of the invention, the system is configured as a redundant array of independent storage units. The configuration is also known as a redundant array of independent disks (RAID). This enables more reliability, specifically in the case of a complete failure of one storage unit. Data loss is thus reduced by inter-disk redundancy provided by the redundant array of independent storage units and the intra-disk redundancy provided by the redundancy set. The advantageous embodiment of the third aspect of the invention is not limited to disks and also may comprise any other kind of storage unit.

According to an embodiment of a fifth aspect of the present invention, there is provided a computer program product for reducing data loss comprising a computer readable medium embodying program instructions executable by a computer. The program instructions correspond to an embodiment of the second aspect of the invention and the advantages thereof.

According to an embodiment of the sixth aspect of the present invention, there is provided a computer program for reducing data loss comprising program instructions. The program instructions correspond to an embodiment of the second aspect of the invention and the advantages thereof.

BRIEF DESCRIPTION OF THE DRAWINGS

Reference will now be made, by way of example, to the accompanying drawings, in which:

FIG. 8 shows a parity check matrix representing an automatically created error correction coding scheme based on the parity check matrix shown in FIG. 6C;

FIG. 9 shows a flow chart of a method for reducing data loss, and

FIG. 10 shows a table presenting properties of the error correction coding scheme based on the parity check matrices shown in FIGS. 5, 6B, 6C and 8, respectively.

DETAILED DESCRIPTION

Figure 1:
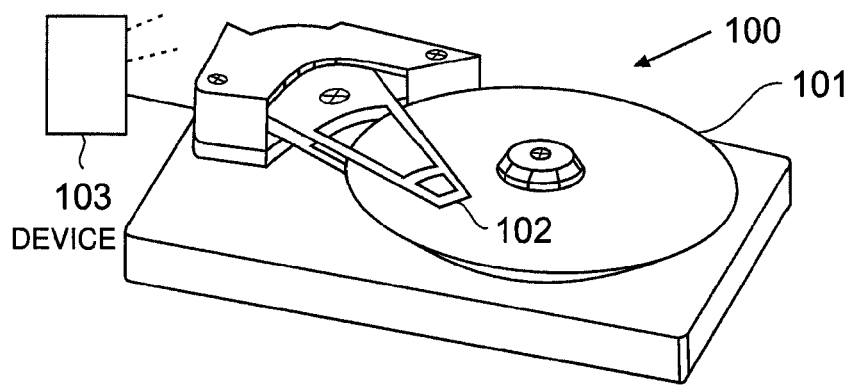
FIG. 1 schematically illustrates a system.

FIG. 1 shows a system that will be used to gain an understanding of an embodiment of the present invention. The system comprises at least one storage unit 100, which is, in the present embodiment, represented by a hard disk drive comprising at least one magnetic disk 101 as storage medium and a read/write head 102. The read/write head 102 can be positioned over a selected track on the at least one magnetic disk 101. Binary data is stored on the magnetic disk 101 by selectively orienting magnetization in selected data fields on the magnetic disk 101 with the read/write head 102. The system further comprises a device 103 for reducing data loss. The at least one storage unit 100 is coupled with the device 103.

Figure 2:
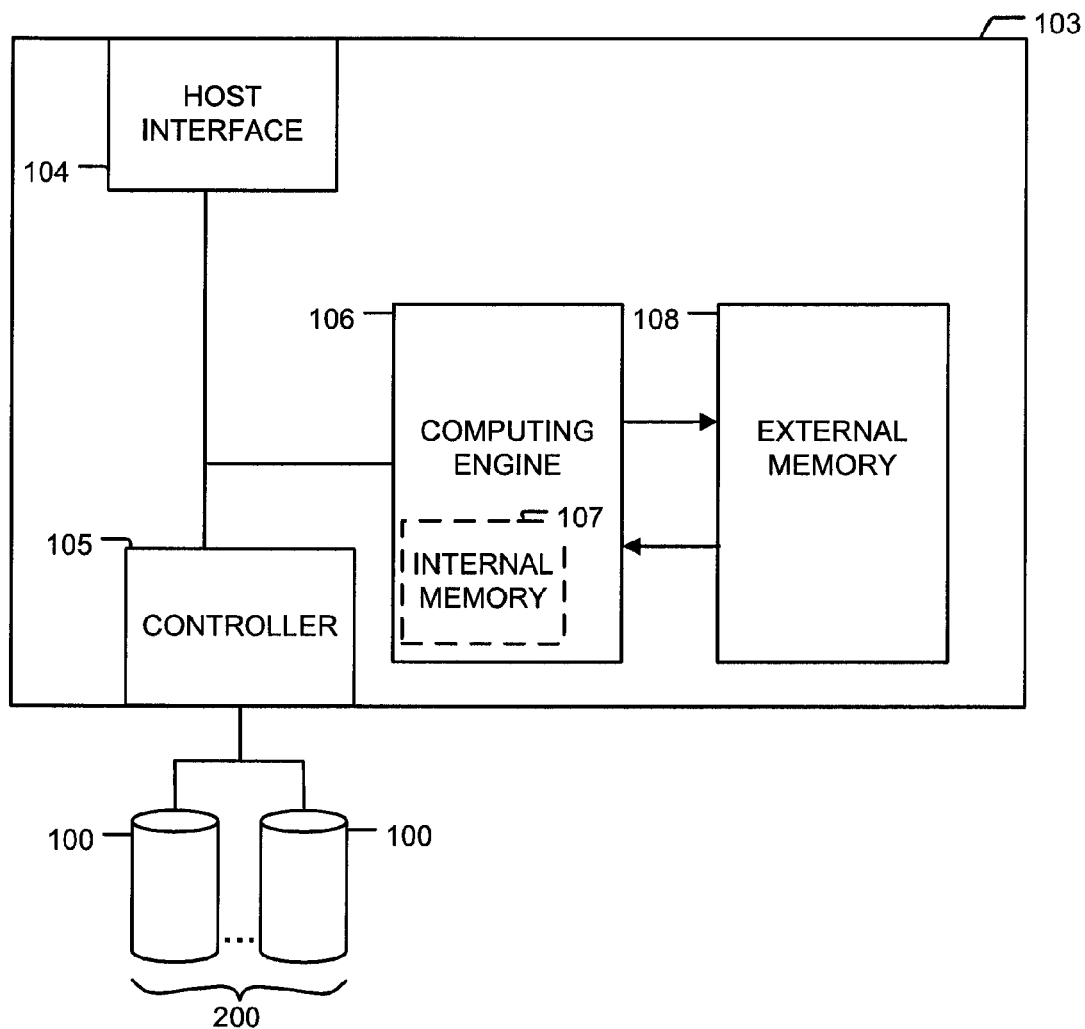
FIG. 2 is a block diagram of the system shown in FIG. 1.

FIG. 2 shows a block diagram of the system shown in FIG. 1. The device 103 comprises a host interface 104 for coupling to a host, e.g. a computer system, a controller 105 for controlling the at least one storage unit 100, a computing engine 106 comprising an internal memory 107 and an external memory 108 coupled to the computing engine 106. The host interface 104, the controller 105 and the computing engine 106 are coupled such that data can be transferred by request from the at least one storage unit 100 to the host interface 104 or vice versa and between the host interface 104 and the computing engine 106 or between the controller 105 and the computing engine 106.

Figure 3:
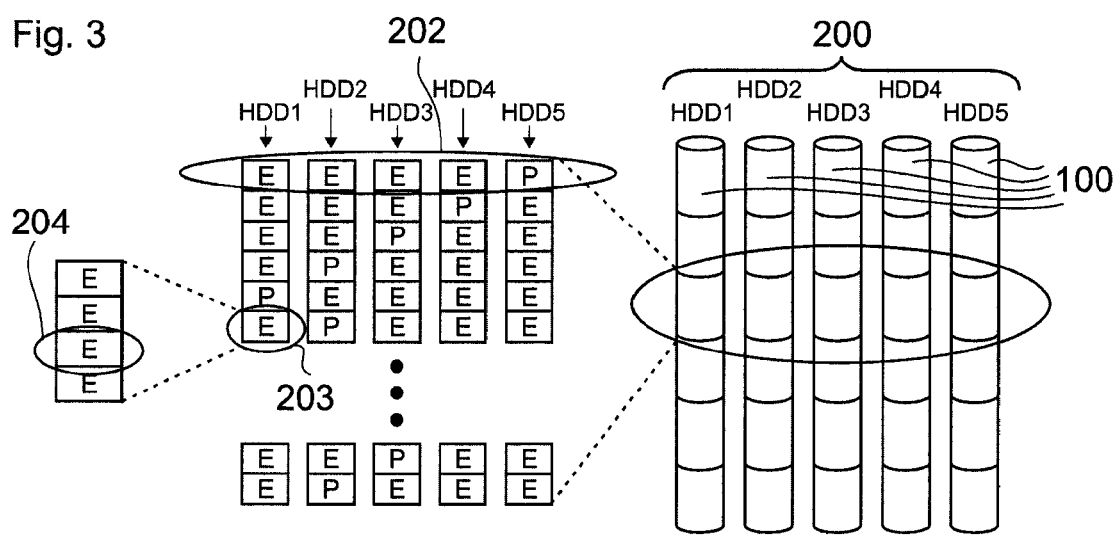
FIG. 3 is an overview of data organization in a RAID level 5 configured system comprising five storage units.

FIG. 3 shows an overview over data organization in a RAID level 5 configured system comprising an array 200 of five storage units 100 that are labeled as a first storage unit HDD1, a second storage unit HDD2, a third storage unit HDD3, a fourth storage unit HDD4, and a fifth storage unit HDD5. The five storage units 100 are respectively coupled with the device 103.

Data is organized in stripes 202. The stripes 202 span all five storage units 100. Each individual storage unit 100 of the system comprises one strip 203 for each stripe 202. Each strip 203 comprises four segments 204 and each segment 204 comprises sixteen chunks of data, each comprising eight sectors. Each segment 204 therefore has 128 sectors.

In the RAID level 5 configured system, each strip 203 carries either user data E or RAID parity data P. The RAID parity data P is computed as modulo 2 sum, also known as exclusive-or or XOR, of all user data E in the same stripe 202. The location of the RAID parity data P is respectively rotated from one storage unit 100 to one of the other storage units 100 in the array 200 in successive stripes. If one of the storage units 100 fails, the respective user data E and RAID parity data P stored on the failed storage unit 100 can be recovered from the other user data E and RAID parity data P stored in the same stripe 202 on the other storage units 100 that are still working. A RAID level 5 configured system allows rebuilding of the information content of one failed storage unit 100 by recovering the lost data and writing it on a spare storage unit 100 included in the system.

Before the reconstruction is finished, data loss will happen in a RAID level 5 configured system if either a second storage unit 100 fails or a media error occurs on one of the other storage units 100. As the storage capacity of individual storage units 100 grows, the total number of bytes that are read during a rebuild operation becomes larger. This increases the probability of encountering an uncorrectable media error, typically resulting in one or more sectors becoming unreadable. The occurrence of uncorrectable media errors is particularly problematic when combined with a failure of one storage unit 100 in the system. For example, if one storage unit 100 fails in a RAID level 5 configured system, the rebuild process reads all the data on the remaining storage units 100 in order to rebuild the lost data on the spare storage unit 100. During this phase, an uncorrectable media error on any of the still working storage units 100 in the array 200 would lead to data loss because there is no way to reconstruct the information content of the uncorrectable sectors. The risk of data loss in this vulnerable phase becomes worse due to the continuous rapid increase of disk capacity and much slower advance in disk bandwidth and disk reliability. Theoretical and field results have shown that the dominant source of data loss in RAID level 5 configured systems is media-related failure during rebuilding.

Figure 4:
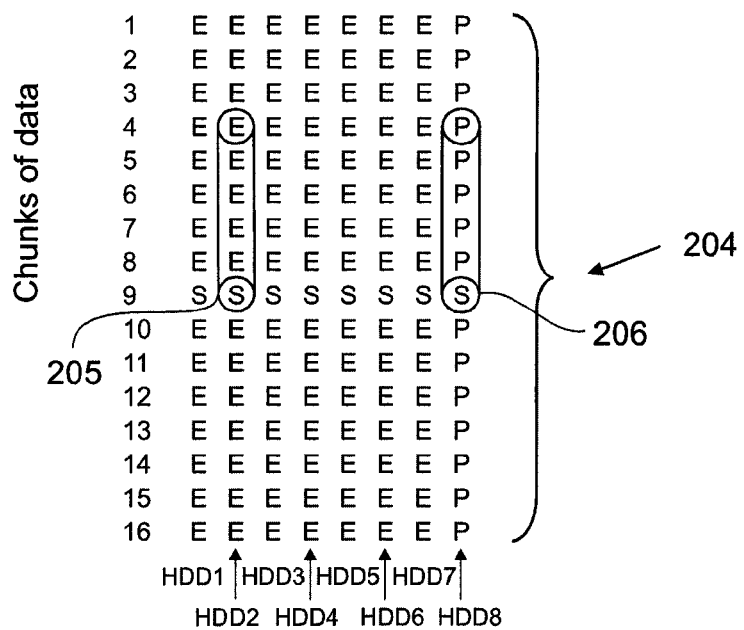
FIG. 4 is an overview of data organization of one segment in a RAID level 5 configured system comprising eight storage units.

The risk of data loss due to one or more media errors can be reduced by providing intra-disk redundancy, also called Sector Protection through Intra-Disk REdundancy (SPIDRE). FIG. 4 is an overview of data organization of one segment 204 of a further RAID level 5 configured system comprising eight storage units 100 labeled as the first storage unit HDD1, the second storage unit HDD2, the third storage unit HDD3, the fourth storage unit HDD4, the fifth storage unit HDD5, a sixth storage unit HDD6, a seventh storage unit HDD7, and an eighth storage unit HDD8. The segment 204 comprises sixteen chunks of data on each of the storage units 100 that either carry user data E, RAID parity data P or intra-disk redundancy data S. Each segment 204 on each storage unit 100 has one chunk of data carrying intra-disk redundancy data S. The intra-disk redundancy data S respectively is associated to the user data E or RAID parity data P of segment 204 on the same storage unit 100. The computing engine 106 in device 103 is operable to compute and to provide the information content of intra-disk redundancy data S computed from the user data E and RAID parity data P of segment 204, respectively, when user data E and RAID parity data P, respectively, is written to or updated in segment 204. The computing engine 106 is further operable to recover the information content of user data E and RAID parity data P, respectively, of unreadable sectors from the information content of other user data E and RAID parity data P, respectively, and the intra-disk redundancy data S of the same segment 204 stored on the same storage unit 100.

The concept of intra-disk redundancy can be applied to any of the existing RAID architectures or levels, e.g. RAID level 5, level 51, level 6 or level N+3. RAID redundancy provided by the RAID redundancy data P primarily reduces loss of data stored on the array 200 due to the failure of one complete storage unit 100. The intra-disk redundancy reduces loss of data stored on each individual storage unit 100 due to uncorrectable media errors. As can be appreciated, the concept of intra-disk redundancy can also be applied to a system comprising only one single storage unit 100.

Every modification of user data E in segment 204, e.g. the fourth chunk of data of segment 204 on the second storage unit HDD2, should be accompanied by the update of the intra-disk redundancy data S associated to the modified user data E in the same segment 204, e.g. the ninth chunk of data of segment 204 on the second storage unit HDD2. Further, the RAID parity data P corresponding to the modified user data E should also be updated, e.g. the fourth chunk of data of segment 204 on the eighth storage unit HDD8. Due to the update of the RAID parity data P the intra-disk redundancy data S associated to the updated RAID parity data P should also be updated, e.g. the ninth chunk of data of segment 204 on the eighth storage unit HDD8. Writing these four chunks of data individually would lead to four requests. By storing the intra-disk redundancy data S consecutively with the user data E in the same segment 204, only a first request 205 and a second request 206 are used to update the chunk of user data E, the chunk of RAID parity data P and the respective corresponding chunks of intra-disk redundancy data S.

In normal operation, i.e. without failure of any storage unit 100, user data E can be read from the at least one storage unit 100 without also reading the corresponding RAID parity data P. Accordingly, user data E can be read from the at least one storage unit 100 without also reading intra-disk redundancy data S as long as no media error occurs while reading the user data E. Reading of several consecutive chunks of user data E is advantageously done with a single request. This request may also comprise reading the intra-disk redundancy data S if it is located between chunks of user data E covered by the request. As can be appreciated, the information content of the intra-disk redundancy data S can be ignored in this case.

Each request for updating user data E uses the reading and writing of at least two chunks of data on at least two storage units 100: the modified user data E and RAID parity data P, respectively, and the respectively corresponding intra-disk redundancy data S. Reading and writing each of the four chunks of data with an individual request would use four requests for reading plus four requests for writing for each update of user data E. By applying the first request 205 and the second request 206, updating of user data E is achieved with only two requests for reading plus two requests for writing. One or more additional chunks of data, particularly user data E or RAID parity data P, that are logically placed in-between the modified chunk of user data E or RAID parity data P and the corresponding chunk of intra-disk redundancy data S may be read and written with the same request, respectively. The requested number of chunks of data for each request therefore depends on the distance between the modified chunk of user data E or RAID parity data P and the corresponding chunk of intra-disk redundancy data S. The average number of chunks of data of all requests for reading and/or writing are reduced by placing the intra-disk redundancy data S approximately in the middle of segment 204 compared to placing it at the beginning or the end of segment 204. In the present embodiment, the average number of chunks of data read and/or written per request is about 5.27. A typical ratio of seek time for each request to the time used to read one chunk of data of, for example, 4 KB is about 50 to 1. The effect of reading and/or writing more than one chunk of data with each request on the overall read/write performance, particularly when updating user data E, is therefore smaller compared to accessing each of the four chunks of data of the above example for updating user data E, RAID parity data P and intra-disk redundancy data S with individual requests.

As an example, each chunk of data has a size of 4 KB. Segment 204 has 128 sectors. Each chunk of data is divided into eight sectors. The chunk of data carrying the intra-disk redunancy data S is considered as a redundancy set of redundancy information sectors R. A number r of redundancy information sectors R is 8. Each chunk of user data E has eight data information sectors D. There are fifteen chunks of user data E in segment 204. A number n of data information sectors D carrying user data E therefore is 120. All 120 data information sectors D of all chunks of user data E of segment 204 are considered a data set. The redundancy set is associated with the data set in segment 204. The information content of the redundancy set is computed dependent on the information content of the data set. Particularly, the redundancy information sectors R in the redundancy set each can be considered as a parity that is computed dependent on a respectively associated subset of the data set, i.e. each redundancy information sector R is computed as parity of a respectively associated set of data information sectors D that is a subset of the data set.

In case a chunk of user data E cannot be read correctly from storage unit 100, this chunk of user data E is marked as a so called "erasure". The information content of the erasure can in some cases be recovered using the information content of other chunks of user data E and the intra-disk redundancy data S of the same segment 204 on the same storage unit 100. The error correction capability, or more precisely, the erasure recovery capability achieved by providing the redundancy set that is associated with the data set in segment 204 depends on the respective selection of data information sectors D that are used for computing the respective redundancy information sector R. It is desirable to compute the information content of the redundancy set with as few computing operations as possible so as to reduce the need to use a complex computing engine 106.

Figure 5:
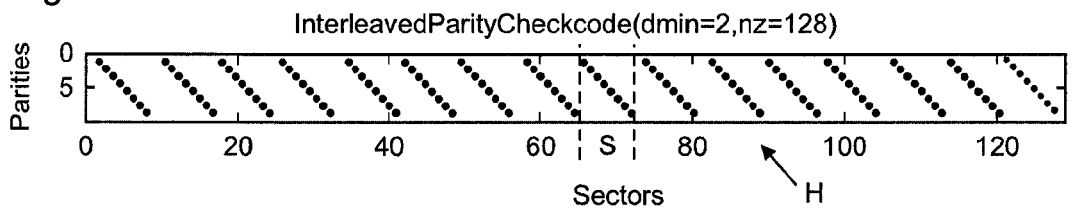
FIG. 5 shows a parity check matrix representing an interleaved parity check code.

FIG. 5 shows a parity check matrix H that represents a so-called interleaved parity check code (PC code), particularly an IPC-8 (128, 120) code, which is usable in an embodiment of the present invention and from hereon referred to as the first type of parity check matrix. The parity check matrix H has eight rows, one for each redundancy information sector R in the redundancy set. The parity check matrix H further has 128 columns, one for each sector of segment 204. Non-zero elements in the parity check matrix H are shown as dots. The interleaved parity check code has eight non-zero elements for each chunk of data. The non-zero elements are placed on the main diagonal of each distinct eight by eight sub-matrix representing one chunk of data. All non-zero elements in each row of the parity check matrix H mark all sectors that form the respectively associated subset of the data set used for computing the respective redundancy information sector R. The respective redundancy information sector R is computed by computing the exclusive-or of all data information sectors D marked in the respective row of the parity check matrix H. Applying the interleaved parity check code, there is a number nz of non-zero elements of 128, i.e. 128 exclusive-or computations should be performed for computing the information content of the redundancy set, i.e. the intra-disk redundancy data S for segment 204. The interleaved parity check code has a minimum Hamming distance dmin of 2. The IPC-8 (128, 120) code has the property of correcting up to the number r of redundancy information sectors R, i.e. up to eight, consecutive sectors with a media error and any single one sector media error in segment 204.

Figure 6A:
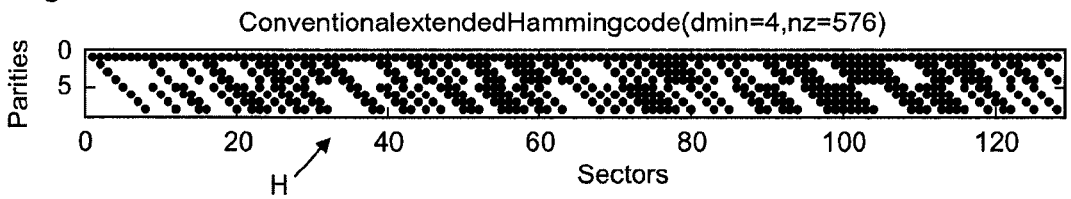
FIG. 6A shows a parity check matrix representing a known extended Hamming code.
Figure 6B:
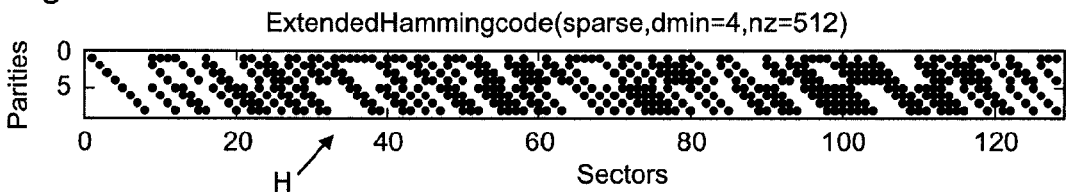
FIG. 6B shows a parity check matrix of a sparse extended Hamming code.
Figure 6C:
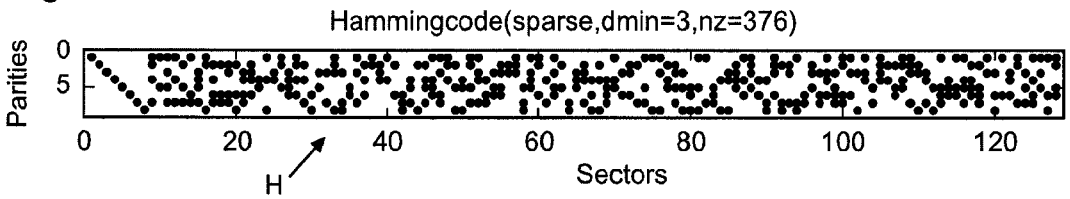
FIG. 6C shows a parity check matrix of a sparse Hamming code.

FIGS. 6A to 6C show a second, a third and a fourth type of parity check matrix H, respectively, usable in an embodiment of the present invention. The second type of parity check matrix H shown in FIG. 6A is a known extended Hamming code with a minimum Hamming distance dmin of 4. The number nz of non-zero elements in this parity check matrix H is 576. The third type of the parity check matrix H shown in FIG. 6B is an extended Hamming code with the parity check matrix H being sparse, i.e. having a reduced number nz of non-zero elements of 512. The minimum Hamming distance dmin is 4. In the fourth type of the parity check matrix H shown in FIG. 6C the number nz of non-zero elements is further reduced. FIG. 6C shows a Hamming code with the parity check matrix H being sparse and the minimum Hamming distance dmin being 3. The number nz of non-zero elements is 376.

Both the third and the fourth type of the parity check matrix H have the least number nz of non-zero elements for the given minimum Hamming distance dmin of 4 or 3, respectively, and for the number r of redundancy information sectors R of 8 and the number n of data information sectors D of 120.

It is possible to ensure, for a minimum Hamming distance dmin of 3, that parity check matrix H has the least number nz of non-zero elements, because the columns of the parity-check matrix H representing the Hamming code are formed from a set of binary tuples with the number r of redundancy information sectors R elements representing all non-zero numbers up to two raised to the power of the number r of redundancy information sectors R minus one. The columns of the parity check matrix H can be sorted to have columns with increasing number nz of non-zero elements from left to right. If less than two raised to the power of the number r of redundancy information sectors R minus one columns are used for representing all sectors of segment 204, the least number nz of non-zero elements can be guaranteed by selecting the left-most columns. For a minimum Hamming distance dmin greater than 3 the least number of non-zero elements cannot be guaranteed in the same way.

The third and the fourth type of the parity check matrix H are also modified such that they show the same properties regarding the error correction capability of correcting up to the number r of redundancy information sectors R, i.e. up to eight, consecutive sectors with a media error as the interleaved parity check code. In comparison to the interleaved parity check code, the extended Hamming code has the advantage of a better error correction capability due to the minimum Hamming distance dmin of 4 or 3, respectively. This additionally enables correcting any three and two sector media errors in segment 204, respectively. In general, the minimum Hamming distance dmin minus one single media errors can be corrected in segment 204. Using the extended Hamming code thus leads to improved protection on storage unit 100 and therefore to increased reliability of the storage unit 100 but also increases the computing power of the computing engine 106 for performing the higher number of exclusive-or operations due to the higher number nz of non-zero elements in the parity check matrix H compared to the interleaved parity check code. Error correction capability of the interleaved parity check code can be applied to most high-end storage units 100, particularly for most high-end hard disk drives (such as, for example, incorporating small computer system interfaces, SCSI). One of the extended Hamming codes with a higher error correction capability compared to the interleaved parity check code may be considered for low-end storage units 100, particularly for low-end hard disk drives (such as, for example, incorporating, advanced technology attachment systems, ATA or serial advanced technology attachments systems, SATA).

In order to reduce the need to use a complicated computing engine 106 and to guarantee certain properties of the data protection, e.g. the error correction capability of correcting up to the number r of redundancy information sectors R consecutive unreadable sectors due to a media error, the parity check matrix H can be improved. Two metrics are introduced for better comparison of different error correction coding schemes based on different parity check matrices H.

A first metric is XORO, the XOR Overhead. XORO is a measure of the computational cost of programming an XOR engine to complete all the exclusive-or operations for a given task, e.g. computing the information content of the redundancy set. The XOR engine is represented by the computing engine 106. For a single exclusive-or computation with a number k of operands, XORO is defined as XORO(k)=k+1. XORO does not account for the size of the operands.

The given task consumes memory bandwidth for sub-tasks such as moving data or parity between the storage unit 100 and the external memory 108, sending user data E from the external memory 108 to the host, e.g. the computer system, through the host interface 104 or moving data or parity into or out of the XOR engine, i.e. the computing engine 106. The consumption of memory bandwidth is quantified by a second metric called MBWC. If, for example, the given task is to compute the exclusive-or of a given number of chunks of data, e.g. of user data E or RAID parity data P, received from the host and writing these plus the computed result, e.g. the intra-disk redundancy data S, to the at least one storage unit 100, the memory bandwidth consumption MBWC in completing this given task is made up of several components. In a first component, the given number of chunks of data received from the host are written to the external memory 108. In a second component, the given number of chunks of data are read from the external memory 108 into the computing engine 106. In a third component, the computed result is written back to the external memory 108. In a fourth component, the given number of chunks and the computed result are written to the at least one storage unit 100. The total number of chunks of data transferred to and from the external memory is therefore three times the given number of chunks of data plus two for the computed result. In this example, all chunks of data are of the same size, e.g. 4 KB.

The computation of XORO is further illustrated with the IPC-8 (128, 120) code. Each of the redundancy information sectors R is the result of exclusive-or operations on fifteen distinct data information sectors D from among the total 120 data information sectors D of segment 204. The interleaved dependence of redundancy information sectors R on data information sectors D is captured in the 8 by 128 parity check matrix H with a regular pattern comprising sixteen distinct 8 by 8 pattern sub-matrices having elements on a respective main diagonal being non-zero. All other elements of each 8 by 8 pattern sub-matrix are zero. If all 120 data information sectors D of segment 204 are stored in the external memory 108, each of the eight redundancy information sectors R can be computed using an exclusive-or operation with fifteen source operands, i.e. data information sectors D, and one destination operand, i.e. redundancy information sector R. The XORO value for the computation of each redundancy information sector R is therefore equal to sixteen and the XORO value for the computation of all eight redundancy information sectors R is 128. In this case, computation of each redundancy information sector R is done sector by sector. The complexity of the computing engine can be reduced taking into account that the 120 data information sectors D are stored consecutively in contiguous locations in the external memory 108. All eight redundancy information sectors R can then be computed with a single exclusive-or operation with fifteen source operands and one destination operand. However, in this case, each operand spans eight consecutive sectors. The computed redundancy information sectors R are also stored consecutively in the external memory 108. The XORO value for computing all eight redundancy information sectors R is therefore 16. The MBWC value does not change due to the different computation of the redundancy information sectors R and equals 47 chunks of data. In contrast to the above-described case, computation of each redundancy information sector R is done chunk by chunk in the present scenario.

Figure 7:
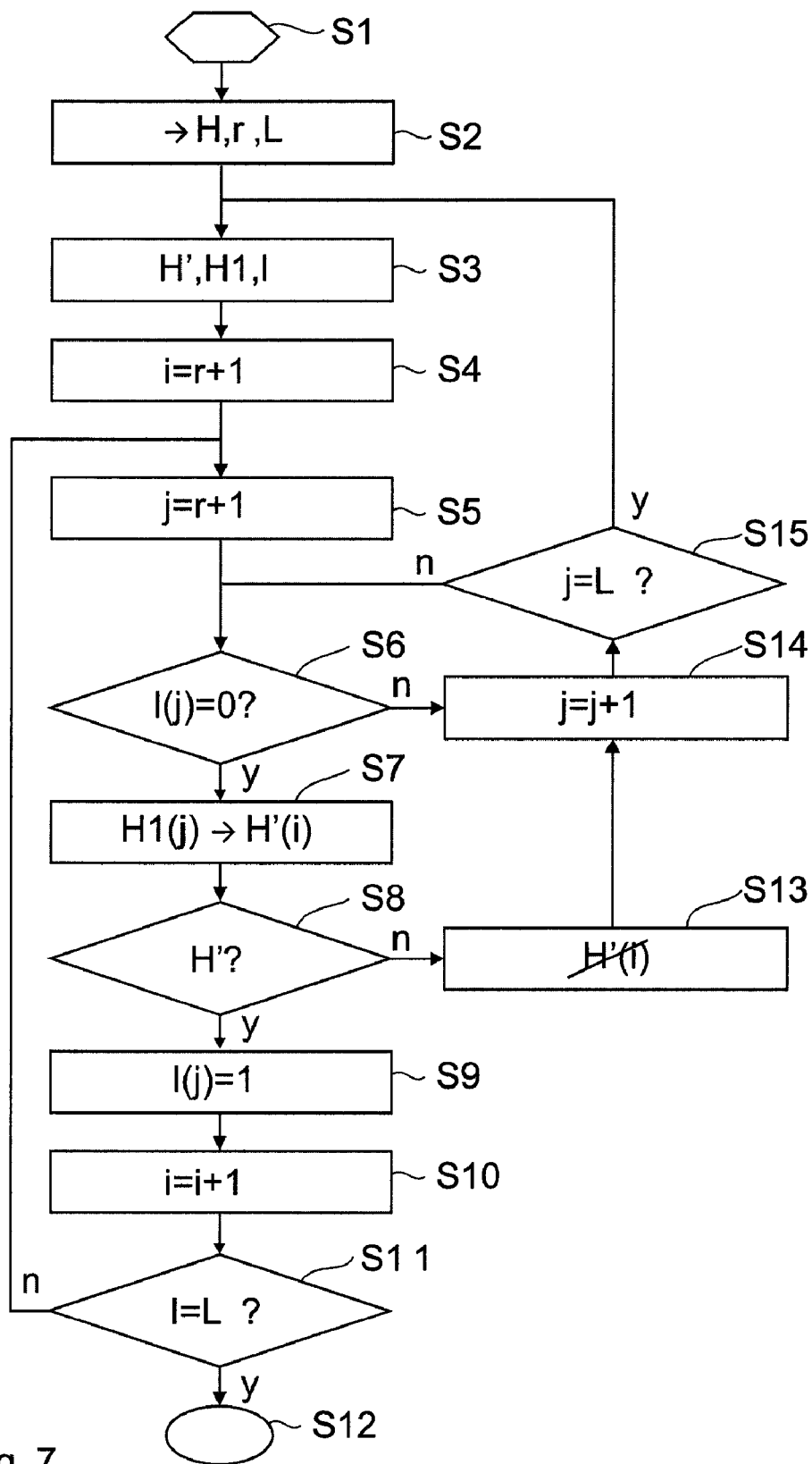
FIG. 7 shows a flow chart of a method for automatically creating an error correction coding scheme.

FIG. 7 shows a flow chart of a method for automatically creating an error correction coding scheme for reducing data loss. The created error correction coding scheme provides a balance in respect to the reduction of complexity of the computing engine 106 and the memory bandwidth consumption, i.e. the XORO value and the MBWC value. In a base selection step, the parity check matrix H, e.g. the fourth type of the parity check matrix H, is selected as a base matrix. In a matrix setup step, the selected base matrix is then modified such that it exhibits a given pattern of non-zero elements, e.g. similar to the regular pattern of pattern sub-matrices according to the IPC-8 (128, 120) code. The given pattern can be different, though, depending on the requirements.

The method begins with a step S1 as an entry point. In a step S2, the base selection step is performed. Additionally, the number r of redundancy information sectors R and a number L of sectors in segment 204 are set. For example, the number r of redundancy information sectors R is 8 and the number L of sectors in segment 204 is 128, comprising both the eight redundancy information sectors R and the 120 data information sectors D. In a step S3 a target matrix H' is set up. In this example the target matrix H' is set up as a square identity matrix with a number of rows and columns equal to the number r of redundancy information sectors R. The identity matrix represents the redundancy information sectors R. Further, a randomized base matrix H1 is set up by randomly changing the order of columns of the selected base matrix, i.e. the selected parity check matrix H, excluding the first number r of redundancy information sectors R columns, if these already represent the identity matrix, as it is the case if the fourth type of the parity check matrix H is selected as the base matrix. Additionally, a vector I is set up comprising one element for each sector in segment 204, i.e. the number of elements of vector I being equal to the number L of sectors. The first number r of redundancy information sectors R elements of vector I are set to one, the other elements are set to zero. In vector I, all columns of the randomized base matrix H1 that are also present in the target matrix H' are marked by a one.

In a step S4, a value of a first variable i is set to the number r of redundancy information sectors R plus one. Accordingly, in a step S5, a value of a second variable j is set to the number r of redundancy information sectors R plus one. The first variable i represents an index of the current column in target matrix H'. The second variable j represents an index of the current column in randomized base matrix H1. In a step S6, it is checked if the element of vector I pointed to by the second variable j is equal to zero. If this is the case, i.e. the corresponding column of the randomized base matrix H1 is not present in the target matrix H' yet, the column of the randomized base matrix H1 pointed to by the second variable j is appended to the target matrix H' at the position pointed to by the first variable i in a step S7.

In a step S8, it is checked if the target matrix H' satisfies a given set of predetermined conditions. The predetermined conditions depend on the requirements for the resulting error correction coding scheme. This given set of predetermined conditions may, for example, comprise the target matrix H' exhibiting the given pattern of non-zero elements, e.g. that elements on the main diagonal of the respective pattern sub-matrix are predominantly non-zero. This can, for example, easily be checked by masking the corresponding elements and counting the number of non-zero elements covered by the mask. If the counted number of non-zero elements per pattern sub-matrix exceeds a given threshold the pattern can be considered to be present in the respective pattern sub-matrix of the target matrix H'.

The set of predetermined conditions may also comprise the target matrix H' exhibiting a given property regarding the error correction capability of the resulting error correction coding scheme. For example, to achieve the capability of correcting up to the number r of redundancy information sectors R of consecutive unreadable sectors in segment 204, each square check sub-matrix of the target matrix H' with a number of columns equal to the number r of redundancy information sectors R should have a rank equal to the number r of redundancy information sectors R.

If the target matrix H' satisfies all predetermined conditions in the given set of predetermined conditions to a given extent the column appended to the target matrix H' is kept and the current element of vector I is set to one in a step S9. Satisfying the predetermined conditions to a given extent means, for example, that not all of the distinct square sub-matrices of the target matrix H' should exhibit the given pattern but at least a given number or percentage of the sub-matrices exhibit the given pattern. In a step S10, the value of the first variable i is increased by one. In a step S11 it is checked if the value of the first variable i is equal to the number L of sectors in segment 204. If this is the case, the method ends in a step S12. Otherwise the method continues in step S5.

If the target matrix H' in step S8 does not satisfy all predetermined conditions in the given set of predetermined conditions to the given extent the column appended to the target matrix H' is deleted in a step S13. The value of the second variable j is then increased in a step S14 to try the next column of the randomized base matrix H1. In a step S15, it is checked if the value of the second variable j is equal to the number L of sectors in segment 204. If this is not the case, the method continues in step S6. Otherwise there are no more columns available to try. In this case, the method continues in step S3, i.e. the target matrix H' and the vector I are reset and a new randomized base matrix H1 is created from the base matrix by randomly reordering the columns of the selected base matrix. The method also continues in step S14 if the current element of vector I is not equal to zero in step S6.

FIG. 8 shows a fifth type of parity check matrix H that was derived as the resulting target matrix H' according to the method presented in FIG. 7. This parity check matrix H satisfies the conditions of having the elements on the main diagonal of each square pattern sub-matrix predominantly non-zero and of having the capability of correcting up to eight consecutive unreadable sectors in segment 204 when applied as error correction coding scheme. Additionally, a further predetermined condition is to have, if possible, the elements of a respective neighboring diagonal in each pattern sub-matrix predominantly non-zero. This predetermined condition is satisfied for twelve pattern sub-matrices of the fifth type of parity check matrix H.

The XORO value and the MBWC value can be further reduced by enabling the computing engine 106 to perform operations on intermediate results stored in the internal memory 107 and to overwrite source operands with the computed result or with an intermediate result T and by taking advantage of the given pattern of non-zero elements comprising the main diagonal and the neighboring diagonal of pattern sub-matrices being predominantly non-zero. Operations performed only on the data stored in the internal memory 107 do not contribute to the MBWC value because no data movement between the computing engine 106 and the external memory 108 is used. The contribution to the XORO value is 2 for these operations. It is therefore advantageous to compute the redundancy information sectors R by utilizing intermediate results T stored in the internal memory 107 of the computing engine 106.

For the example shown in FIG. 8, the following computations can be performed. The respective information content of the data information sectors D corresponding to the elements of the main diagonal of the respective pattern sub-matrix are processed resulting in a first, a second, a third, a fourth, a fifth, a sixth, a seventh and an eighth intermediate result T1, T2, T3, T4, T5, T6, T7, T8 that together form the intermediate result T stored in the internal memory 107. These can be computed with one single exclusive-or operation with an operand size of eight sectors as explained above. This can be written as

T=[T1, T2, T3, T4, T5, T6, T7, T8]=XOR(C9, C17, ... C97)

with the size of each operand being 8, or differently written

T1=C9*C17* ... *C97
T2=C10*C18* ... *C98
T3=C11*C19* ... *C99
T4=C12*C20* ... *C100
T5=C13*C21* ... *C101
T6=C14*C22* ... *C102
T7=C15*C23* ... *C103
T8=C16*C24* ... *C104 for the second to the thirteenth main diagonal with Cx representing the information content of the data information sector D in the x-th sector of segment 204 and '*' representing the exclusive-or operation. The XORO value is 12 and the MBWC value is 12×8 sectors, i.e 96 sectors, for this exclusive-or operation. The elements on the respective corresponding neighboring diagonal can now be processed utilizing the intermediate result T:

T1=XOR(T1, T2)
T2=XOR(T3, T3)
T3=XOR(T3, T4)
T4=XOR(T4, T5)
T5=XOR(T5, T6)
T6=XOR(T6, T7)
T7=XOR(T7, T8)

with the size of each operand being 1, or differently written

T1=T1*T2=C9*C10*C17*C18* ... *C97*C98
T2=T2*T3=C10*C11*C18*C19* ... *C98*C99
T3=T3*T4=C11*C12*C19*C20* ... *C99*C100
T4=T4*T5=C12*C13*C20*C21* ... *C100*C101
T5=T5*T6=C13*C14*C21*C22* ... *C101*C102

T6=T6*T7=C14*C15*C22*C23* . . . *C102*C103
T7=T7*T8=C15*C16*C23*C24* . . . *C103*C104.

This results to a XORO value of 7×2, i.e. 14, and a MBWC value of zero for this step. The fourteenth, fifteenth and sixteenth main diagonal are processed as follows:
T=[T1, T2, T3, T4, T5, T6, T7, T8]=XOR(T1, C105, C113, C121) with the size of each operand being 8, or differently written
T1=T1*C105*C113*C121
T2=T2*C106*C114*C122
T3=T3*C107*C115*C123
T4=T4*C108*C116*C124
T5=T5*C109*C117*C125
T6=T6*C110*C118*C126
T7=T7*C111*C119*C127
T8=T8*C112*C120*C128.

The XORO value for this step is 3 and the MBWC value is 3×8, i.e. 24. The total XORO value after this step is 30 and the total MBWC value is 128 sectors or sixteen chunks of data.

The remaining non-zero elements of the parity check matrix H can then be processed individually sector by sector. There are 164 non-zero elements in the parity check matrix H not located on one of the main diagonals or on one of the neighboring diagonals. Additionally, there are eight elements on main diagonals or neighboring diagonals that are zero. These together require additional 172 exclusive-or operations with the operand size of one sector. This results in an additional XORO value of 172 and MBWC value of 172 sectors. The total XORO value is therefore 202 and the MBWC value is 300 sectors or 37.5 chunks of data for computing the information content of the redundancy set. An additional fifteen plus sixteen chunks of data contribute to the MBWC value due to moving fifteen chunks of user data E from the host to the external memory 108 and to moving the fifteen chunks of user data E and the computed intra-disk redundancy data S as the result to the at least one storage unit 100. The total MBWC thus is about 69 chunks of data.

In order to place the redundancy information sectors R approximately in the middle of segment 204 as described above the columns of parity check matrix H can be shifted cyclically. For example, the original columns C1 to C64 of the the embodiment of the parity check matrix H become columns C65 to C128 and the original columns C65 to C 128 become columns C1 to C64. By this the redundancy information sectors R are moved from columns C1 to C8 to columns C65 to C72. It can be verified that this cyclic shift of columns does not change the capability of correcting up to eight consecutive unreadable sectors in segment 204 for the embodiment of the parity check matrix H.

FIG. 9 shows a flow chart of a method for reducing data loss that may be implemented in hardware in the device 103. The method also can be implemented as a computer program comprising program instructions that can be performed by a computer. The device 103 may comprise a computer for performing the program instructions of the computer program. The computer program may alternatively be part of an operating system or of a basic input/output system of the computer system. A computer readable medium may be provided embodying the program instructions executable by device 103 or the computer system. The computer readable medium may for example be a CD-ROM, a flash memory card, a hard disc or any other suitable computer readable medium.

The method shown in FIG. 9 utilizes the error correction coding scheme created by the method shown in FIG. 7 and performs the computations explained above for FIG. 8. The method begins in a step S20. In a step S21 a first computing step is performed by computing the intermediate result T for the redundancy information sectors R by processing the information content of the data information sectors D on the main diagonals of the pattern sub-matrices as explained above. In a step S22 the information content of the data information sectors D on the neighboring diagonals of the pattern sub-matrices is processed utilizing the intermediate result T overwriting the previously computed intermediate result T as explained above. In a step S23 the information content of the redundancy information sectors R is computed dependent on the intermediate result T, e.g. by processing the remaining non-zero elements of the parity check matrix H as explained above. The method ends in a step S24.

FIG. 10 shows a table with the minimum Hamming distance dmin, the burst erasure recovery, i.e. the error correction capability of correcting consecutive unreadable sectors, the number nz of non-zero elements in the parity check matrix H, the XORO value and the MBWC value for the third, the fourth, the fifth and the first type of the parity check matrix H, respectively. In the table, the third type of the parity check matrix H is labelled "Extended Hamming code", the fourth type is labelled "SD3" for Sparsest Distance 3, the fifth type is labelled "OSD3" for Optimized Sparsest Distance 3 and the first type is labelled "IPC-8".

The embodiments explained above are based on sectors as information entity. Alternatively, information entities can also represent a bit, a byte or any other suitable entity of information. The redundancy information sectors R and the data information sectors D represent specific embodiments and can more generally be considered as redundancy information entities R and data information entities D, respectively. Further, reduction of data loss due to media errors on a storage unit 100 is only one of many applications. For example, loss of data transmitted or received over a radio channel or cable can also be reduced by applying the error correction coding scheme presented above.

It will be understood that the present invention has been described purely by way of example, and modifications of detail can be made within the scope of the invention.

Each feature disclosed in the description, and (where appropriate) the claims and drawings may be provided independently or in any appropriate combination.

The invention claimed is:

1. A method for creating an error correction coding scheme which reduces data loss at a plurality of data storage units, the data of the plurality of data storage units comprising a given redundancy set of at least two redundancy information entities (R) associated to a given data set of at least two data information entities (D), the information content of the redundancy set being computed dependent on the information content of the data set, the method comprising the steps of:

a base selection step (S2) for selecting a base coding scheme for a computing engine in communication with the plurality of storage units, the base coding scheme represented by a base matrix wherein each redundant information entity (R) is represented by a row and each information entity is represented by a column; and a matrix setup step (S3) for setting up a target matrix (H') with a subset of columns of the base matrix and for varying the order of columns with respect to the base matrix until the target matrix (H') satisfies a given pattern of non-zero elements to at least a given extent;

wherein:

the given pattern of non-zero elements is selected to comprise a main diagonal with elements being predominantly non-zero of a square pattern sub-matrix of the target matrix (H') having a number of rows and columns equal to a number (r) of redundancy information entities (R) in the redundancy set;

the given pattern of non-zero elements is selected to further comprise a neighboring diagonal disposed adjacent to the main diagonal of the square pattern sub-matrix of the target matrix (H'), the elements of the neighbouring diagonal being chosen to be predominantly non-zero;

the base matrix is selected to have the least possible number (nz) of non-zero elements for a given Hamming distance (dmin) of the base coding scheme, number (n) of data information entities (D) in the data set and number (r) of redundancy information entities (R) in the redundancy set;

in the matrix setup step (S3), the order of the columns is varied until each square check sub-matrix of the target matrix (H') with a number of columns equal to the number (r) of redundancy information entities (R) in the redundancy set has a rank equal to the number (r) of redundancy information entities (R) in the redundancy set;

the created error correction scheme is based on respectively computing the exclusive-or of the information content of all data information entities (D) represented by a non-zero element in each row of the target matrix (H'); and the base coding scheme is based on one of the following: a Hamming code or an extended Hamming code.

2. A device for reducing data loss at a plurality of data storage units, the device being in communication with the plurality of storage units, the data of the plurality of data storage units comprising a given redundancy set of at least two redundancy information entities (R) associated to a given data set of at least two data information entities (D), the information content of the redundancy set being computed dependent on the information content of the data set by applying an error correction coding scheme represented by a parity check matrix (H) wherein each redundant information entity (R) is represented by a row and each information entity of the data is represented by a column, and at least two square sub-matrices of the parity check matrix (H) having a main diagonal with elements being predominantly non-zero and having a number of rows and columns equal to a number (r) of redundancy information entities (R) in the redundancy set and representing consecutively placed data information entities (D) of the data set, being operable to:

compute in a first computing operation at a computing engine of the device an intermediate result (T) for the redundancy information entities (R) by processing the data information entities (D) on the at least two main diagonals, and compute in a second computing operation at the computing engine of the device the information content of the redundancy information entities (R) dependent on the intermediate result (T); wherein:

at least one square sub-matrix of the parity check matrix (H) with elements of the main diagonal being predominantly non-zero further has a neighboring diagonal with elements being predominantly non-zero;

the second computing operation comprises processing the data information entities (D) on the respective neighboring diagonal utilizing the intermediate result (T); and the respective information content of each redundancy information entity (R) in the redundancy set is computed as exclusive-OR of the respective information content of all data information entities (D) in the data set represented by a non-zero element in the respective row of the parity check matrix (H).

3. A computer program product embodied on a computer readable storage medium having computer readable code thereon for reducing data loss, the data comprising a given redundancy set of at least two redundancy information entities (R) associated to a given data set of at least two data information entities (D), the information content of the redundancy set being computed dependent on the information content of the data set by applying an error correction coding scheme represented by a parity check matrix (H) wherein each redundant information entity (R) is represented by a row and each information entity of the data is represented by a column, and at least two square sub-matrices of the parity check matrix (H) having a main diagonal with elements being predominantly non-zero and having a number of rows and columns equal to a number (r) of redundancy information entities (R) in the redundancy set and representing consecutively placed data information entities (D) of the data set, the computer readable code comprising program instructions that when executed by a computer apparatus direct the computer apparatus to:

compute in a first computing operation an intermediate result (T) for the redundancy information entities (R) by process-ing the data information entities (D) on the at least two main diagonals, and compute in a second computing operation the information content of the redundancy information entities (R) dependent on the intermediate result (T); wherein:

at least one square sub-matrix of the parity check matrix (H) with elements of the main diagonal being predominantly non-zero further has a neighboring diagonal with elements being predominantly non-zero;

the second computing step comprises processing the data information entities (D) on the respective neighboring diagonal utilizing the intermediate result (T); and the respective information content of each redundancy information entity (R) in the redundancy set is computed as exclusive-OR of the respective information content of all data information entities (D) in the data set represented by a non-zero element in the respective row of the parity check matrix (H).

* * * * *